(12) United States Patent
Francis et al.

(10) Patent No.: US 6,980,577 B1
(45) Date of Patent: Dec. 27, 2005

(54) VERTICAL LASER CAVITY WITH A NON-PLANAR TOP MIRROR

(75) Inventors: Daniel A. Francis, Oakland, CA (US); Chris Decker, Danville, CA (US)

(73) Assignee: Finisar Corporation, Sunnyvale, CA (US)

( * ) Notice: Subject to any disclaimer, the term of this patent is extended or adjusted under 35 U.S.C. 154(b) by 117 days.

(21) Appl. No.: 10/392,671

(22) Filed: Mar. 18, 2003

Related U.S. Application Data

(60) Provisional application No. 60/365,466, filed on Mar. 18, 2002.

(51) Int. Cl.[7] ................................. H01S 5/00
(52) U.S. Cl. ..................... 372/50; 372/43; 372/99; 372/107
(58) Field of Search .................. 372/43–50, 99, 372/107

(56) References Cited

U.S. PATENT DOCUMENTS 5,223,723 A * 6/1993 Luryi .................... 257/184
6,744,805 B2 * 6/2004 Wang et al. ............. 372/99

OTHER PUBLICATIONS

"GaAs Buried Heterostructure Vertical Cavity Top-Surface Emitting Lasers," Akira Ibaraki, Kotaro Furusawa, Toru Ishikawa, Kiichi Yodoshi, Takao Yamaguchi, and Tatushiko Niina, IEEE Journal of Quantum Electronics, vol., 27, No. 6, Jun. 1991.

"Low-Threshold Surface-Emitting Laser Diodes With Distributed Bragg Reflectors And Current Blocking Layers," M. Shimada, T. Asaka, Y. Yamasaki, H. Iwano, M. Ogura, and S. Mukai, American Institute of Physics, Appl. Phys. Letr, 57(13), Sep. 24, 1990.

"C-Band Tunable 6 MW Vertical-Cavity Surface-Emitting Lasers," D. Vakhshoori, J. H. Zhou, M. Jiang, M Azimi, K. McCallion, C. C. Lu, K.J. Knopp, J. Cai, P.D. Wang, P. Tayebati, H. Zhu, P. Chen, Electronics Letters, May 9, 1996, vol. 32, No. 10.

"Room-Temperature CW 1.5 μm InGaAlAs/Inp Vertical-Cavity Laser With High Efficiency," M. Ortsiefer, R. Shau, G. Bohm, F. Kohler, M.C. Amann, date unknown.

* cited by examiner

*Primary Examiner*—Min Sun Harvey
*Assistant Examiner*—Delma R. Flores-Ruiz
(74) *Attorney, Agent, or Firm*—Workman Nydegger

(57) ABSTRACT

A vertical laser cavity includes a non-planar top mirror in order to improve the optical performance of the laser cavity. In one approach, the top mirror is curved to form a plano-concave geometry with the bottom mirror, as opposed to the typical plano—plano geometry. This can reduce diffraction losses and otherwise improve optical performance.

29 Claims, 5 Drawing Sheets

VERTICAL LASER CAVITY WITH A NON-PLANAR TOP MIRROR

CROSS-REFERENCE TO RELATED APPLICATION

This application claims priority under 35 U.S.C. § 119(e) to U.S. Provisional Patent Application Ser. No. 60/365,466, "Vertical laser cavity with a non-planar top mirror," by Daniel A. Francis and Chris Decker, filed Mar. 18, 2002. The subject matter of the foregoing is incorporated herein by reference in its entirety.

BACKGROUND OF THE INVENTION

1. Field of the Invention

This invention relates generally to semiconductor-based vertical laser cavities (e.g., as used in VCSELs). More specifically, the top mirror of the laser cavity is non-planar, thus enhancing the performance of the laser cavity.

2. Description of the Related Art

As the result of continuous advances in technology, optical devices are becoming more important and more prevalent. For example, the increasing demand for communications bandwidth has resulted in an increased interest in optical communications systems, including those that transmit data over optical fibers. This, in turn, has resulted in increased demand for optical devices for use in these systems.

One general class of optical devices is those that are based on vertical laser cavities. In these devices, a laser cavity is formed by a bottom mirror and a top mirror and is oriented vertically with respect to a supporting substrate. In one common approach, different layers of material are epitaxially grown on the substrate to build up the vertical laser cavity one layer at a time. Pumping the active region within the laser cavity above its lasing threshold results in laser action. The laser action can be used for different purposes, depending on the design of the rest of the device. For example, in vertical cavity surface emitting lasers (VCSELs), the device is used as a source of laser light. The laser radiation generated by the laser cavity is output through one of the mirrors. In vertical lasing semiconductor optical amplifiers (VLSOAs), the device is used as an amplifier. The laser action within the vertical laser cavity gain clamps the active region. A second optical signal passing through the active region experiences amplification without significant gain saturation. For example, see U.S. patent application Ser. No. 10/014,679, "Integrated Optical Device including a Vertical Lasing Semiconductor Optical Amplifier," by Jeffrey D. Walker and Sol P. Dijaili, filed Dec. 11, 2001, which is incorporated herein by reference. Other devices and uses exist for vertical laser cavities.

One drawback of vertical laser cavities is they can be difficult to fabricate and operate. Because of the geometry, the round trip laser path typically is not very long within the active region. This results in relatively low gain for each round trip. As a result, care typically must be taken to ensure that round trip losses are not too large. Otherwise, lasing cannot be achieved. The top and bottom mirrors are one significant component in determining the overall loss and performance of a vertical laser cavity. However, their design is often driven by fabrication limitations, resulting in less than optimal mirror designs.

Thus, there is a need for vertical laser cavities with improved mirror designs.

SUMMARY OF THE INVENTION

The present invention overcomes the limitations of the prior art by providing a vertical laser cavity in which the top mirror is non-planar, thus improving the optical performance of the laser cavity. In one approach, the top mirror is curved to form a plano-concave geometry with the bottom mirror, as opposed to the typical plano-plano geometry. This can reduce diffraction losses and otherwise improve optical performance.

In one embodiment, an optical device includes a planar bottom mirror, a buried active region (e.g., a buried heterojunction) and a non-planar top mirror all integrated on a substrate. The two mirrors form a vertical laser cavity. A current path traverses the buried active region. Electrically pumping the buried active region provides gain for the vertical laser cavity.

In one approach, the non-planar top mirror is formed by underfilling. The vertical laser cavity is fabricated by forming a first set of layers on a substrate. This set includes the bottom mirror. Some of these layers are removed in lateral areas away from the vertical laser cavity. They are replaced by the lateral areas away from the vertical cavity are underfilled. In one approach, the underfill creates a current blocking layer. A second set of layers is formed on top of this. This set includes the top mirror. The underfill causes the non-planar shape of the top mirror.

In a different approach, the non-planar top mirror is formed by introducing a bump in the structure. The vertical laser cavity is fabricated by forming a first set of layers (including the bottom mirror) on a substrate. A seed bump is formed over the first set of layers. A second set of layers (including the top mirror) is then formed over that. The seed bump causes the non-planar shape of the top mirror.

In one particular application, the optical device is designed for use at either the 1.3 micron or the 1.55 micron window. The underlying substrate is n-doped InP, the planar bottom mirror is a Bragg reflector with alternating layers of InP and InGaAsP, the buried active region is either InGaAsP or InAlGaAs, and the non-planar top mirror is a Bragg reflector with alternating layers of InP and InGaAsP (either n-doped or p-doped, depending on the rest of the structure). The vertical laser cavity is electrically pumped. Current blocking layers may be used to confine the pumping current.

Other aspects of the invention include devices (e.g., VCSELs and VLSOAs) that utilize these vertical laser cavities and methods for fabricating these vertical laser cavities.

BRIEF DESCRIPTION OF THE DRAWINGS

The invention has other advantages and features which will be more readily apparent from the following detailed description of the invention and the appended claims, when taken in conjunction with the accompanying drawing, in which:

DETAILED DESCRIPTION OF THE PREFERRED EMBODIMENTS

Figure 1:
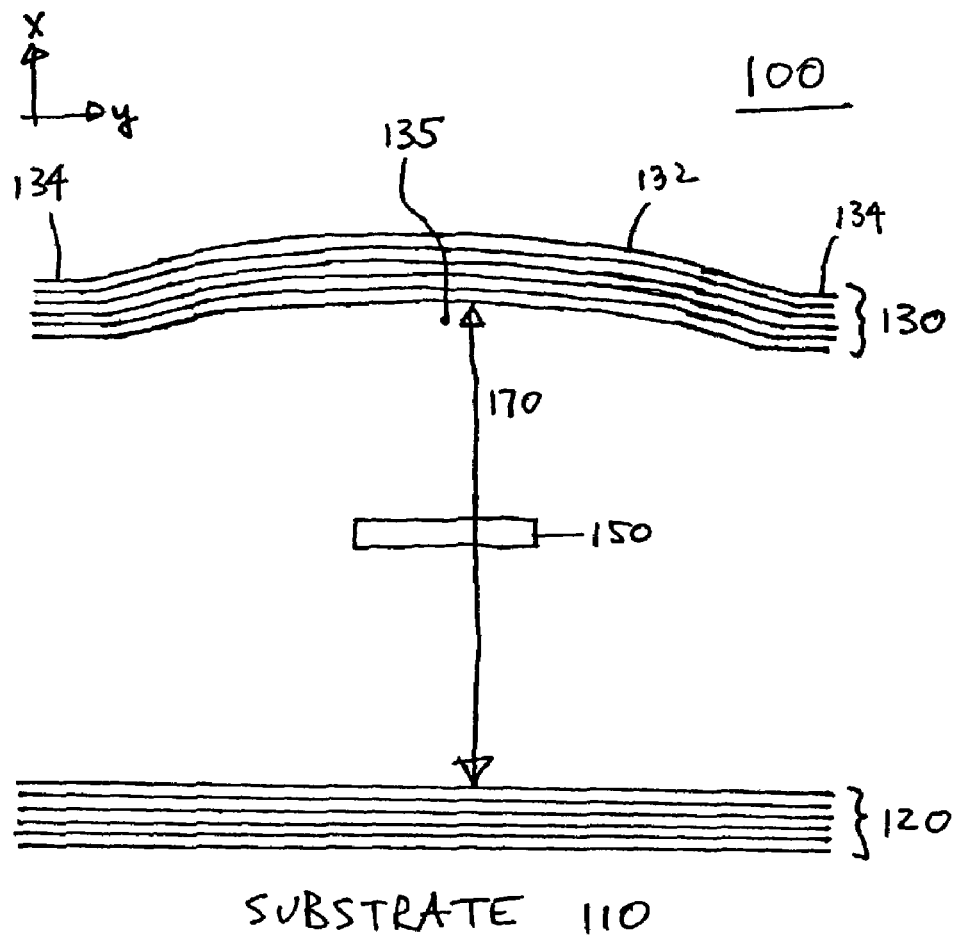
FIG. 1 is a cross-section of a vertical laser cavity according to the invention.

FIG. 1 is a cross-section of a vertical laser cavity 100 according to the invention. FIG. 1 is simplified to show only the relevant portions of the laser cavity 100. Other portions of the cavity (e.g., to achieve control over the laser mode, the pumping mechanism, etc.) have been omitted for clarity and can be designed using conventional techniques. The laser cavity 100 includes a bottom mirror 120 and a top mirror 130, and an active region 150 located in an optical path between the two mirrors 120, 130. The entire structure is fabricated on a substrate 110. It is vertical in the sense that the laser cavity 100 is oriented vertically with respect to the substrate surface. The laser cavity 100 is primarily a planar structure, but the top mirror 130 is non-planar. More specifically, the center portion 132 of the top mirror 130 is raised relative to the outer portions 134. In effect, there is a "bump" 135 in the materials underneath the top mirror 130. Then, when the top mirror 130 is formed on top of the bump 135, the mirror is non-planar and has a somewhat curved shape.

The vertical cavity 100 is a layered structure, allowing the structure 100 to be fabricated using standard semiconductor fabrication techniques, preferably including organo-metallic vapor phase epitaxy (OMVPE) or organometallic chemical vapor deposition (OMCVD). Other common fabrication techniques include molecular beam epitaxy (MBE), liquid phase epitaxy (LPE), photolithography, e-beam evaporation, sputter deposition, wet and dry etching, wafer bonding, ion implantation, wet oxidation, and rapid thermal annealing, among others. In one approach, the different features shown in FIG. 1 are planar and built upon a substrate 110; the active region 150 is implemented as a buried feature.

The choice of materials system for the vertical cavity 100 will depend in part on the wavelength of the optical signal, which in turn will depend on the application. Wavelengths in the approximately 1.3–1.6 micron region are currently preferred for telecommunications applications, due to the spectral properties of optical fibers. In particular, currently there are two common transmission windows for optical fiber: one at approximately 1.3 micron and another at approximately 1.55 micron. The 1.55 micron window currently can include shorter wavelengths (e.g., the S-band, 1450–1530 nm), centered wavelengths (e.g., C-band 1530–1560 nm), or longer wavelengths (e.g., L-band 1570–1610 nm). In addition, the approximately 1.28–1.35 micron region is currently also preferred for data communications over single mode fiber, with the approximately 0.8–1.1 micron region being an alternate wavelength region. The term "optical" is meant to include all of these wavelength regions.

The active region 150 can be implemented in a number of ways. In one embodiment, the active region 150 includes a multiple quantum well (MQW) active region. MQW structures include several quantum wells and quantum wells have the advantage of enabling the formation of lasers with relatively low threshold currents. In alternate embodiments, the active region 150 may instead be based on a single quantum well or a double-heterostructure active region. The active region 150 may be based on various materials systems, including for example InAlGaAs on InP substrates, InAlGaAs on GaAs, InGaAsP on InP, GaInNAs on GaAs, InGaAs on ternary substrates, and GaAsSb on GaAs. Nitride material systems are also suitable. The surrounding materials will depend in part on the composition of active region 150. The active region 150 can be pumped by many different mechanisms, including electrical and optical pumping. In the figures, the active region 150 is shown as having a finite lateral extent but this is not required.

Examples of top and bottom mirrors 130 and 120 include Bragg reflectors, non-Bragg reflectors such as metallic mirrors, and hybrid mirrors consisting of a Bragg reflector in combination with a metallic mirror. Bragg reflectors may be fabricated using various materials systems, including for example, alternating layers of GaAs and AlAs, $SiO_2$ and $TiO_2$, InAlGaAs and InAlAs, InGaAsP and InP, AlGaAsSb and AlAsSb or GaAs and AlGaAs. Gold is one material suitable for metallic mirrors.

Laser cavity 100 operates as follows. The active region 150 provides gain. When the active region 150 is pumped above the lasing threshold, the cavity 100 lases. This produces a lasing field 170 within the cavity and optionally also a laser output from the mirror(s). The longitudinal mode of the laser field 170 lies in the x direction; the transverse modes lie in the y and z directions.

The non-planar top mirror 130 is beneficial because it reduces optical losses in the cavity. Vertical cavities typically have low roundtrip gain and therefore require low losses in order to achieve threshold. Optical losses typically must be held to about 1% or less. The non-planar top mirror 130 can help reduce optical losses by a number of mechanisms. One source of loss is diffraction loss at the mirrors. This loss is particularly important for vertical cavities that have a small cross sectional area, for example cavities designed for single mode operation. Threshold currents typically increase dramatically as the lateral dimension of cavities is decreased. At communications wavelengths, single mode cavities typically have lateral dimensions of about 5 microns or less. By introducing some curvature to one of the mirrors, the diffraction loss can be reduced relative to a plano—plano cavity configuration. Another possible source of loss is scattering from rough surfaces. As will be described below, in some cases, the process for creating the non-planar top mirror 130 also tends to improve the surface quality of the mirror 130, thus reducing this type of scattering.

Examples of devices that utilize a vertical laser cavity include vertical cavity surface emitting lasers (VCSELs) and vertical lasing semiconductor optical amplifiers (VLSOAs). In a VCSEL, the laser cavity generates a laser that is the output of the device. In a VLSOA, the laser field acts as a ballast to gain clamp the overall gain of the amplifier.

FIGS. 2–3 are cross-sections of different embodiments of the vertical laser cavity 100. In FIG. 2, the bump 135 is formed by underfilling. In FIG. 3, the bump 135 is formed by depositing material.

The laser cavity 200 in FIG. 2 is fabricated as follows. The process begins with an n-doped substrate 210, which is produced using conventional crystal growing and doping techniques. In a first epitaxy stage, OMCVD is used to grow the following layers: the alternating layers of Bragg reflector 120, n layer 220, active region 150, and p layer 230. The wafer is then removed and a mask, typically either an oxide or nitride mask, is placed over selected areas of the wafer in order to define the lateral extent of the active region 150. Unmasked areas are removed (e.g. using a bromine-based wet etch process), leaving the portions of layers 220, 150 and 230 shown.

Figure 2A:
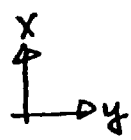
FIGS. 2A–2B are cross-sections illustrating fabrication of one implementation of the vertical laser cavity of FIG. 1.
Figure 2A:
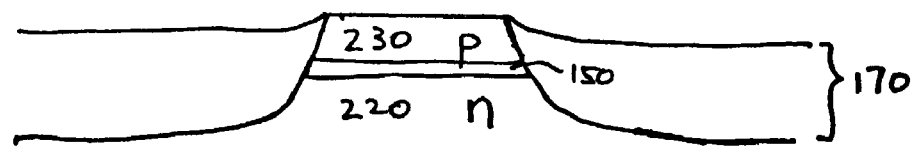
Figure 2A:
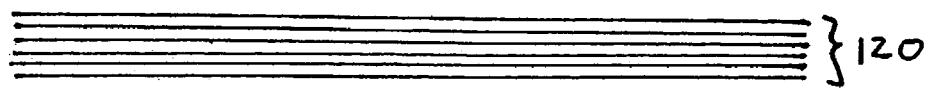

In a second epitaxy stage, a current blocking layer 170 is grown (e.g. p-doped InP and n-doped InP pn blocking layers, or semi-insulating InP layers). This example is electrically pumped and the current blocking layer 170 confines the current to the active region 150. No material grows on top of n layer 130 since it is still masked. The second epitaxy is underfilled so that the surface is not planarized, as shown in FIG. 2A. This is the genesis of the bump 135. The wafer is then removed in order to remove the mask.

Figure 2B:
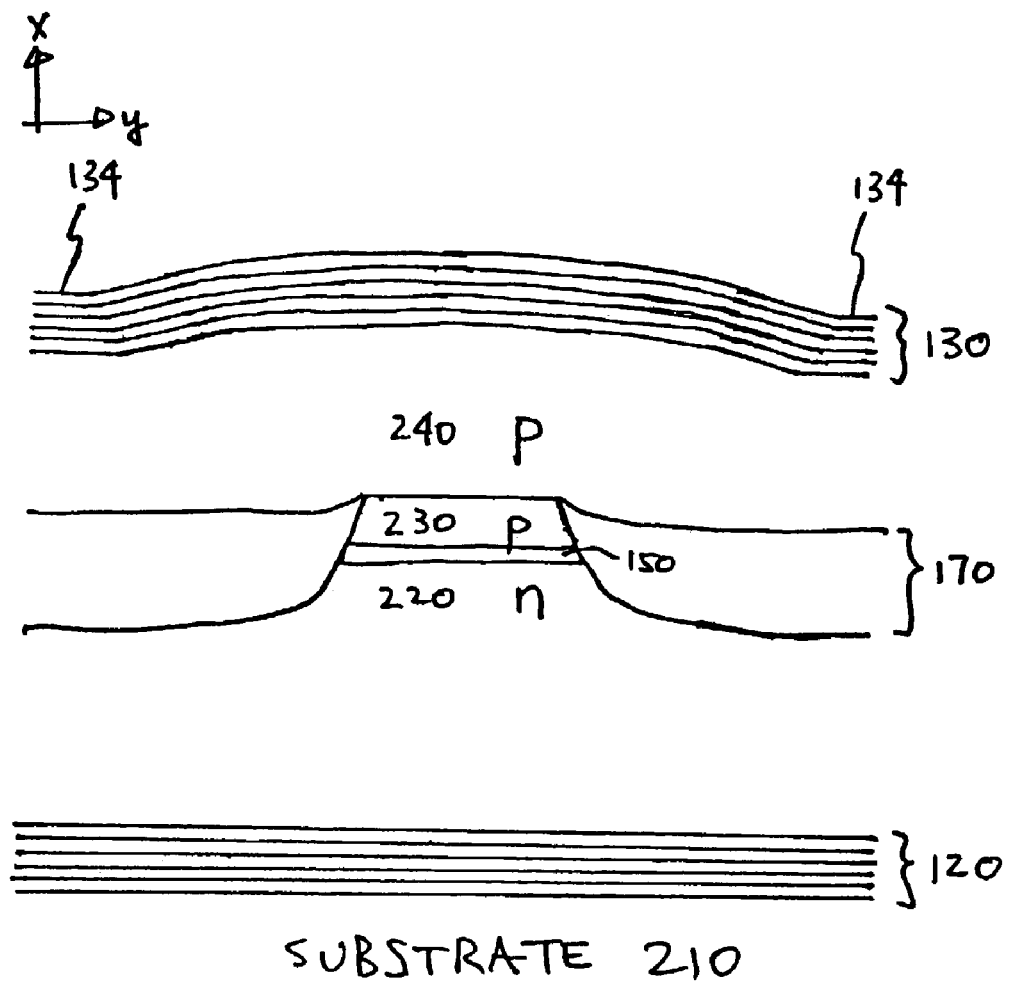

In a third epitaxy stage, p layer 240 and Bragg layers for top mirror 130 are grown, resulting in the structure of FIG. 2B. Due to the underfill of the second expitaxy stage, the Bragg layers are non-planar. The curvature of the top mirror 130 is smoother than the abrupt transition introduced by the underfill because the intervening layers smooth out the transition. For single mode cavities at communications wavelengths, the lateral mode typically is about 5 microns wide or less. Corresponding bumps 135 typically are wider (but not necessarily so) with a height of 0.1–1.0 microns, although actual optimum shapes will depend on specifics of the cavity. For example, in one embodiment for single mode applications at communications wavelengths, the genesis of the bump has a width of about 3 microns and the bump 135 itself has a width of about 5 microns.

In one particular design, the vertical laser cavity can be designed for use in either the 1.3 micron or the 1.55 micron window. The substrate 210 is n-doped InP. The Bragg reflector 120 is alternating layers of InP and InGaAsP. The n layer 220 is n-doped InP, the active region 150 is either InGaAsP or InAlGaAs, and the p layer 230 is p-doped InP. In one variation, layer 230 also includes a tunnel junction which is a backward diode that allows the change of carriers from n type to p type. For example, see U.S. Patent Application Serial No. 60/365,464, "Electrically Pumped Semiconductor Active Region with a Backward Diode, for Enhancing Optical Signals" filed by Jeffrey D. Walker et al. on the same date as this application, and which is incorporated by reference herein. In the embodiment where layer 230 is p doped only, the p layer 240 is p-doped InP and the top mirror 130 preferably is a p doped mirror of InP/InGaAsP. In the embodiment where 230 includes a tunnel junction, the layer 240 is n-doped InP and top mirror 130 preferably is an n doped mirror of InP/InGaAsP. The layers 220, 150, and 230 are etched using a bromine-based wet etch process and then replaced (but underfilled) by current blocking layer 170, which is a semi-insulating InP layer. In a different design, the current blocking layer 170 is implemented by a pn structure using p-doped InP and n-doped InP. In these examples, the genesis of the bump has a width of about 3–5 microns and a height of 0.2 microns, and the resulting bump 135 has a width of about 50 microns and a height of 0.2 microns. The distance between the top and bottom mirrors 130 and 120 is approximately 3–4 microns. The active region 150 is electrically pumped.

The curved top mirror 130 typically reduces diffraction losses due to a lens effect. In addition, the fabrication process described above can also result in a cleaner and smoother top mirror 130, thus reducing scattering loss. Because of the curvature of the bump, irregularities and impurities tend to migrate towards the lower regions 134, which are the regions away from the laser mode.

In FIG. 3, a primarily planar process is used to fabricate the vertical laser cavity. However, at some point in the processing, a "seed bump" 310 is introduced as shown in FIG. 3A. As further layers are built up, the seed bump 310 results in the final bump 135 and curved top mirror 130, as shown in FIG. 3B. The dimensions given previously are also applicable to these types of bumps.

The seed bump 310 can be created in different ways. For example, standard photolithography and etching can be used to remove material on the sides, leaving the seed bump 310. Alternately, material can be deposited in selected areas using conventional techniques, thus forming the seed bump 310.

The seed bump 310 can be used directly as the final bump 135. The seed bump 310 may be the same or different material as the surrounding materials.

Although the invention has been described in considerable detail with reference to certain preferred embodiments thereof, other embodiments will be apparent. For example, the invention is not restricted to the specific laser cavity designs shown here. Nor is it restricted to the particular fabrication techniques described. These are merely examples.

What is claimed is:

1. A layered optical device comprising:
   a substrate;
   in order along a vertical direction away from the substrate:
   a planar bottom mirror;
   a plurality of layers comprising at least a buried active region, wherein at least some of the plurality of layers have been removed in lateral areas away from a central vertical laser cavity;
   underfill in the space vacated by the removed layers, wherein a top surface of the underfill is below a top surface of the unremoved layers such that a non-planar surface is formed; and
   a non-planar top mirror disposed to form a vertical laser cavity with the planar bottom mirror, wherein the planar bottom mirror, buried active region, and non-planar top mirror are integrated on the substrate, and wherein the non-planarity of the top surface is caused by the non-planar surface of the underfill and the unremoved layers; and
   a current path traversing the buried active region, for electrically pumping the buried active region to provide gain for the vertical laser cavity.

2. The device of claim 1 wherein the underfill comprises a current blocking layer.

3. The device of claim 1 wherein the plurality of layers includes, in order along a vertical direction away from the substrate:
   an n-doped layer, the buried active region, and a first p-doped layer; wherein at least a portion of the n-doped layer, the buried active region, and the first p-doped layer have been removed in lateral areas away from the vertical laser cavity; and
   a second p-doped layer that extends laterally beyond the first p-doped layer.

4. A layered optical device comprising:
   a substrate;
   in order along a vertical direction away from the substrate:
   a planar bottom mirror,
   a buried active region, and
   a non-planar top mirror disposed to form a vertical laser cavity with the planar bottom mirror, wherein the planar bottom mirror, buried active region, and non-planar top mirror are integrated on the substrate; and
   a current path traversing the buried active region, for electrically pumping the buried active region to provide gain for the vertical laser cavity;
   wherein the vertical laser cavity further comprises:
   a plurality of layers disposed between the planar bottom mirror and the non-planar top mirror; and
   a seed bump located in the vertical laser cavity between the planar bottom mirror and the non-planar top mirror.

5. The device of claim 1 wherein the buried active region comprises a buried heterojunction.

6. The device of claim 1 wherein the non-planar top mirror has a greater height in a center of the vertical laser cavity than on an edge of the vertical laser cavity.

7. The device of claim 1 wherein the non-planar top mirror is curved.

8. The device of claim 1 wherein the non-planar top mirror has a height of between 0.1–1.0 microns.

9. The device of claim 1 wherein the non-planar top mirror comprises a hybrid mirror.

10. The device of claim 1 wherein the vertical laser cavity is designed for single mode operation.

11. The device of claim 10 wherein the vertical laser cavity has a lateral dimension of less than seven microns.

12. The device of claim 1 wherein laser light is output through the non-planar top mirror or the planar bottom mirror.

13. The device of claim 1 wherein the vertical laser cavity is designed for use at a wavelength of approximately 1.3 micron or approximately 1.55 micron.

14. The device of claim 1 wherein the substrate is an InP substrate.

15. The device of claim 1 wherein the vertical laser cavity gain clamps a gain of the buried active region, and the buried active region is further for amplifying an optical signal propagating laterally through the buried active region.

16. A method for fabricating a vertical laser cavity comprising:
forming first layers on a substrate, the first layers including a planar bottom mirror for a vertical laser cavity;
removing at least some of the first layers in lateral areas away from the vertical laser cavity;
replacing the removed first layers but underfilling the lateral areas away from the vertical laser cavity; and
forming second layers over the first layers and over the underfill, the second layers including a non-planar top mirror for the vertical laser cavity, wherein the non-planarity of the top mirror generally conforms to a non-planarity caused by the underfilled lateral areas.

17. The method of claim 16 wherein:
the step of forming first layers on a substrate comprises epitaxially growing first layers on the substrate;
the step of removing at least some of the first layers in lateral areas away from the vertical laser cavity comprises etching away some of the first layers in lateral areas away from the vertical laser cavity;
the step of underfilling the lateral areas away from the vertical laser cavity comprises epitaxially growing underfill layers in the lateral areas away from the vertical laser cavity; and
the step of forming second layers over the first layers and over the underfill comprises epitaxially growing the second layers over the first layers and over the underfill.

18. The method of claim 17 wherein:
the step of forming first layers on a substrate comprises epitaxially growing an n-doped layer, a buried active region, and a first p-doped layer on the substrate;
the step of removing at least some of the first layers in lateral areas away from the vertical laser cavity comprises etching away some of the n-doped layer, the buried active region, and the first p-doped layer in lateral areas away from the vertical laser cavity;
the step of underfilling the lateral areas away from the vertical laser cavity comprises epitaxially growing a current blocking layer in the lateral areas away from the vertical laser cavity; and
the step of forming second layers over the first layers and over the underfill comprises epitaxially growing a second p-doped layer over the first p-doped layer and over the current blocking layer.

19. The method of claim 16 wherein the substrate is an InP substrate.

20. A method for fabricating a vertical laser cavity comprising:
forming first layers on a substrate, the first layers including a planar bottom mirror for a vertical laser cavity;
forming a seed bump over the first layers, the seed bump located in the vertical laser cavity; and
forming second layers over the first layers and over the seed bump, the second layers including a non-planar top mirror for the vertical laser cavity.

21. The method of claim 20 wherein:
the step of forming first layers on a substrate comprises epitaxially growing first layers on the substrate;
the step of forming a seed bump over the first layers comprises epitaxially growing a seed bump over the first layers; and
the step of forming second layers over the first layers and over the seed bump comprises epitaxially growing the second layers over the first layers and over the seed bump.

22. The method of claim 20 wherein the substrate is an InP substrate.

23. The device of claim 4 wherein the non-planar top mirror has a greater height in a center of the vertical laser cavity than on an edge of the vertical laser cavity.

24. The device of claim 4 wherein the non-planar top mirror is curved.

25. The device of claim 5 wherein the non-planar top mirror has a height of from about 0.1 microns to about 1 micron.

26. The device of claim 4 wherein the non-planar top mirror comprises a hybrid mirror.

27. The device of claim 4 wherein the vertical laser cavity is designed for single mode operation and has a lateral dimension of less than about seven microns.

28. The device of claim 4 wherein the vertical laser cavity is designed for use at a wavelength of approximately 1.3 microns or approximately 1.55 microns.

29. The device of claim 4 wherein the vertical laser cavity gain clamps a gain of the buried active region, and the buried active region is further for amplifying an optical signal propagating laterally through the buried active region.

* * * * *

UNITED STATES PATENT AND TRADEMARK OFFICE
CERTIFICATE OF CORRECTION

PATENT NO. : 6,980,577 B1
APPLICATION NO. : 10/392671
DATED : December 27, 2005
INVENTOR(S) : Francis et al.

It is certified that error appears in the above-identified patent and that said Letters Patent is hereby corrected as shown below:

Title Page
Item (56), References Cited, OTHER PUBLICATIONS, "Room-Temperature…", change "InGaAIAs/Inp" to --InGaAlAs/InP-- (OUTS)

Drawings
Sheet 2, Figure 2A, add global reference numeral --200--, which refers to the entire drawing
Sheet 2, Figure 2A, change reference numeral "170" to --190--
Sheet 3, Figure 2B, add global reference numeral --200--, which refers to the entire drawing
Sheet 3, Figure 2B, change reference numeral "170" to --190--

Column 2
Line 25, after "vertical cavity" insert --that--
Line 58, change "drawing" to --drawings--

Column 3
Line 24, after "vertical" insert --laser--
Line 25, change "structure" to --laser cavity--
Line 42, change "micron" to --microns--
Line 43, change "micron" to --microns--

Figure 3A:
FIGS. 3A–3B are cross-sections illustrating fabrication of another implementation of the vertical laser cavity of FIG. 1.
Figure 3A:
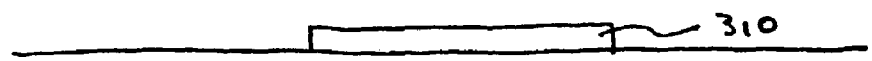
Figure 3A:
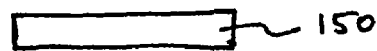
Figure 3A:
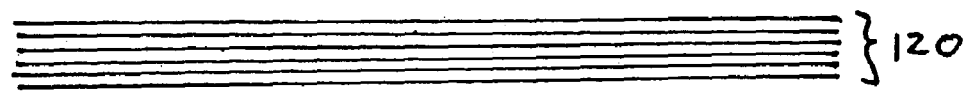
Figure 3B:
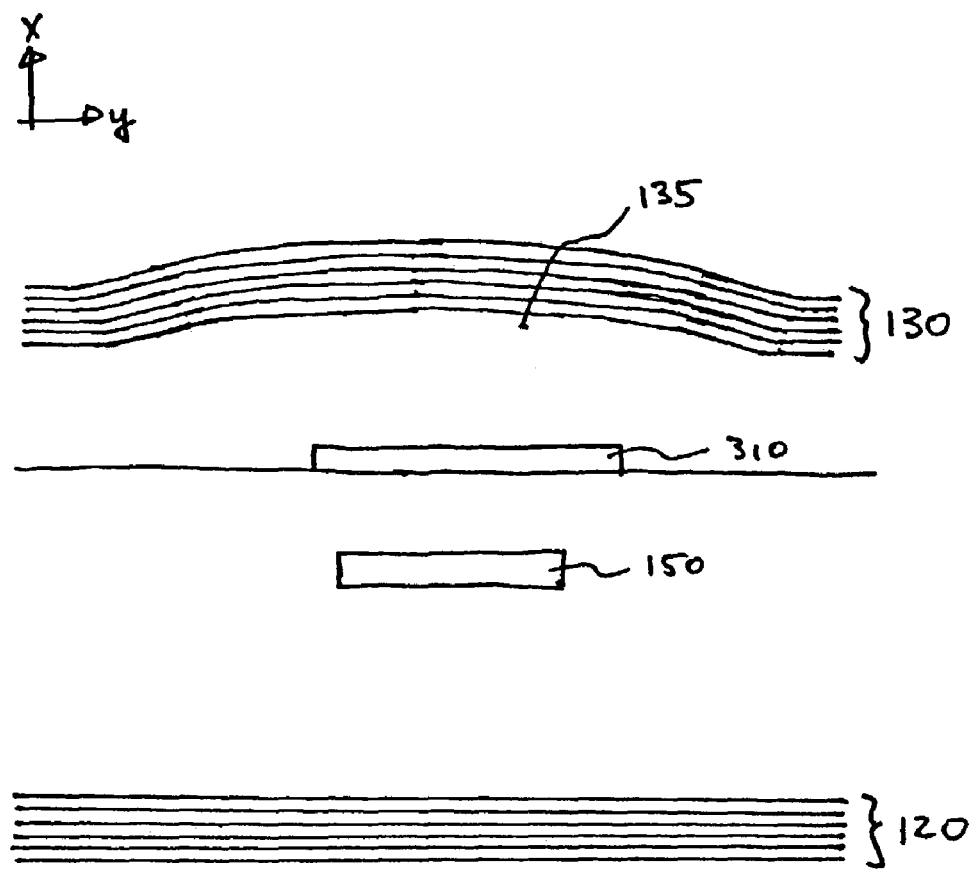

Column 4
Line 47, change "FIG. 2" to --FIG. 2B--
Line 48, change "FIG. 3" to --FIG. 3B--
Line 50, change "FIG. 2" to --FIGS. 2A–2B--
Line 62, change "170" to --190--
Line 64, change "170" to --190--
Line 67, change "n layer 130" to --p layer 230--

Column 5
Line 30, after "Walker et al." insert --filed--
Line 40, change "170" to --190--
Line 41, change "170" to --190--
Line 56, change "FIG. 3" to --FIGS. 3A–3B--

UNITED STATES PATENT AND TRADEMARK OFFICE
CERTIFICATE OF CORRECTION

PATENT NO. : 6,980,577 B1
APPLICATION NO. : 10/392671
DATED : December 27, 2005
INVENTOR(S) : Francis et al.

It is certified that error appears in the above-identified patent and that said Letters Patent is hereby corrected as shown below:

Column 7
Line 19, before "or" change "micron" to --microns--
Line 19, after "1.55" change "micron" to --microns--

Column 8
Line 42, change "claim 5" to --claim 4--

Signed and Sealed this

Fourth Day of March, 2008

JON W. DUDAS
*Director of the United States Patent and Trademark Office*